United States Patent [19]
Bruel

[11] Patent Number: 5,985,688
[45] Date of Patent: Nov. 16, 1999

[54] METHOD FOR INSERTING A GASEOUS PHASE IN A SEALED CAVITY BY ION IMPLANTATION

[75] Inventor: Michel Bruel, Veurey, France

[73] Assignee: Commissariat a l'Energie Atomique, Paris, France

[21] Appl. No.: 08/975,208

[22] Filed: Nov. 20, 1997

[30] Foreign Application Priority Data

Dec. 9, 1996 [FR] France ................................ 9615091

[51] Int. Cl.$^6$ .................................................. H01L 29/82
[52] U.S. Cl. ................................ 438/53; 438/50; 438/407; 438/528; 257/415; 257/419; 257/682
[58] Field of Search ..................................... 257/415, 418, 257/419, 682, 721; 438/53, 51, 524, 515, 528, 407, 50, 52

[56] References Cited

U.S. PATENT DOCUMENTS

| | | | |
|---|---|---|---|
| 4,680,474 | 7/1987 | Turner et al. ......................... | 250/492.2 |
| 4,707,312 | 11/1987 | Bajaj ......................................... | 264/43 |
| 4,849,050 | 7/1989 | Evans et al. .............................. | 438/53 |
| 4,853,669 | 8/1989 | Guckel et al. ............................ | 438/53 |
| 5,242,863 | 9/1993 | Xiang-Zheng et al. .................. | 438/53 |
| 5,804,086 | 9/1998 | Bruel ......................................... | 438/53 |

FOREIGN PATENT DOCUMENTS

| | | | |
|---|---|---|---|
| 2 681 472 | 3/1993 | France . | |
| 40 1175268 | 7/1989 | Japan ..................................... | 257/419 |
| 40 4017376 | 1/1992 | Japan ..................................... | 257/415 |
| 40 5007006 | 1/1993 | Japan ..................................... | 257/415 |

Primary Examiner—Donald L. Monin, Jr.
Assistant Examiner—Michael Dietrich
Attorney, Agent, or Firm—Oblon, Spivak, McClelland, Maier & Neustadt, P.C.

[57] ABSTRACT

A method for inserting a gaseous phase in a sealed cavity including inserting ions in the sealed cavity by ion implantation carried out at an energy level sufficient for the inserted ions to reach the sealed cavity and to form a gas having a gas pressure which deforms a wall of the sealed cavity. The ion implantation is performed using hydrogen ions, or a rare gas ions, such as helium ions. The method may be implemented into a method for manufacturing a structure with a soft electrical contact, a capacitor, or a matrix of pressure sensors.

27 Claims, 3 Drawing Sheets

METHOD FOR INSERTING A GASEOUS PHASE IN A SEALED CAVITY BY ION IMPLANTATION

The present invention relates to a method for inserting a gaseous phase in a sealed cavity. This cavity may be made from any type of solid material: conductor, semiconductor or dielectric.

The insertion of a gaseous phase in a sealed cavity may be of advantage in certain technical areas. In the area of microelectronics in particular, the insertion of a gaseous phase would allow the production of pressurized micro-pads that can be used as pressure sensors or to form soft contact parts.

Obtaining such pressurized micro-pads in devices belonging to the area of microelectronics appears particularly difficult with conventional methods. Most microelectronics processes are conducted in low pressure machines or at atmospheric pressure. Under these conditions, while it is possible to insert a gaseous phase at a determined pressure into a micro-cavity made in a structure by establishing physical communication with a medium containing the gas corresponding to the desired pressure, it is difficult and even impossible to seal the micro-cavity while maintaining the gaseous phase at the required pressure.

The inventor of the present invention found that it is possible to insert a gaseous phase in a closed cavity existing in a structure without having to make physical communication between this cavity and the outside. He discovered that it is possible to insert this gaseous phase by implanting ions able to generate the gas under consideration within the cavity, through a wall sealing this cavity.

The object of the invention is therefore a method for inserting a gaseous phase in at least one sealed cavity existing within a structure, characterized in that it consists of conducting ion implantation to implant ions able to generate the desired gaseous phase within the cavity, said implantation being carried out with sufficient energy for the ions to be able to reach the cavity and in a sufficient dose to obtain the desired pressure within the cavity.

By "ions able to generate the gaseous phase" is meant that these ions inserted into the cavity may, after interaction between themselves and/or with surrounding atoms, produce gas molecules formed through the combination of these ions neutralized between themselves and/or of these ions neutralized with these atoms.

The gaseous phase may be produced by the implantation of ions of different elements. Advantageously, these ions are ions of hydrogen or of rare gases, in particular helium.

Advantageously, the energy use for implantation is such that it provides a theoretic maximum concentration of ions inside the cavity.

Ion implantation may be made in a dose which gives the gaseous phase formed in said cavity sufficient pressure to deform one wall of the cavity. This deformed wall may be given the form of a boss or pad. If the outside surface of this wall is made conductive, the structure may then offer a soft electrical contact for an outside element.

In accordance with a further aspect of the invention, provision may be made for the formation of electrodes that are positioned so as to form at least one capacitor in which said gaseous phase acts as a dielectric.

According to this latter aspect of the invention, the process may be used to obtain a pressure sensor through measurement of capacitor capacity. It may also be used to obtain a matrix of pressure sensors through measurement of the capacities relating to the capacitors formed from a matrix of implanted cavities.

The invention will be better understood and further advantages and characteristics will become apparent on reading the following non-restrictive description given for illustrative purposes with reference to the appended drawings among which:

Figure 1:
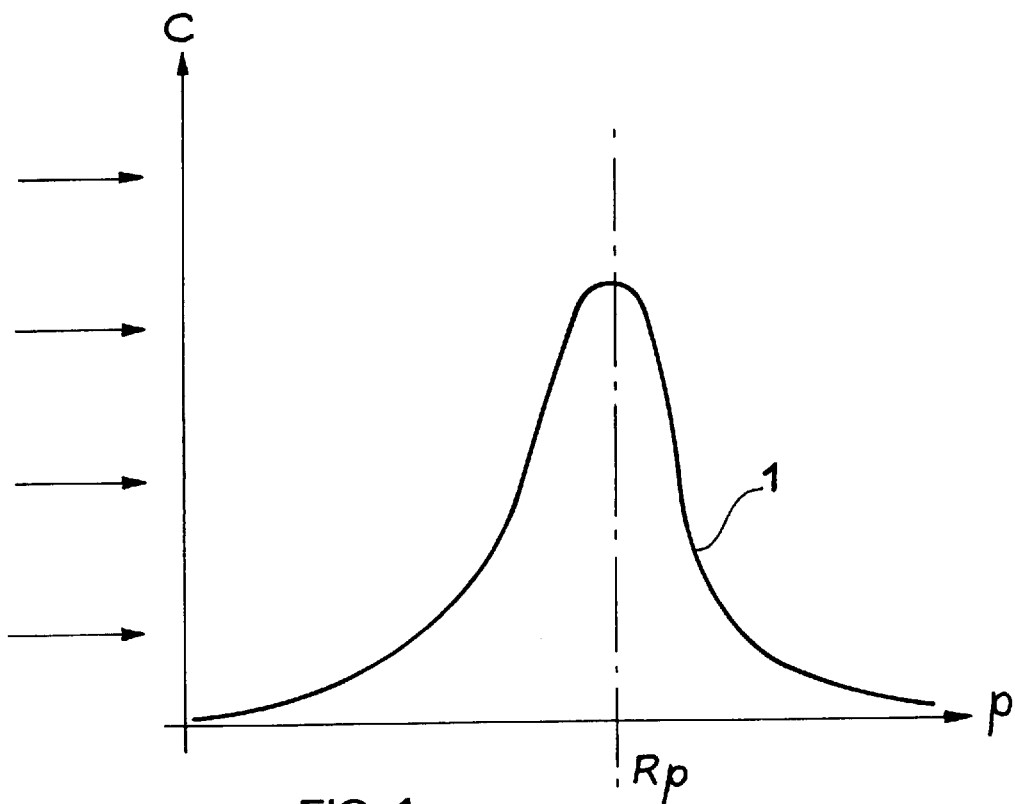
FIG. 1 is a diagram illustrating the concentration profile of the ions implanted in a material.

If a plate in solid material is bombarded with ions, the latter penetrate at varying depths into the plate depending upon the energy imparted to them and depending upon the nature of the material. If it is considered that the plate is made in homogeneous material, that it has one flat surface and ion bombarding is made by a beam of ions with a given energy, the ions implanted in the plate will distribute themselves around an average depth with maximum concentration around this average depth. FIG. 1 shows an example of an ion concentration profile corresponding to the implantation of $H^+$ ions (protons) in a monocrystalline silicon plate. For more details reference may be made to document FR-A-2,681,472 describing a "Method of manufacture of thin films of semiconductor material".

In FIG. 1, the Y axis corresponds to the flat surface of the plate through which an ion beam of determined energy penetrates, as shown by the arrows. The X axis, parallel to the direction of the ion beam, represents depth p of the plate. Tracing 1 is the concentration profile C of the implanted ions, implantation being carried out at a set temperature, for example ambient temperature. Tracing 1 shows that the concentration of implanted ions is at its maximum at depth Rp. It is therefore possible to concentrate a relatively high quantity of ions at a determined depth inside a solid element.

By adjusting implantation parameters in suitable manner, it is therefore possible to achieve a maximum concentration entering the cavity of the ions of the gaseous phase it is required to insert. Masking can be used to insert the gaseous phase solely in the cavity and to avoid any ion implantation in the material surrounding the cavity.

A cavity may exist naturally in the material which forms a structure, but in more usual manner it can be manufactured. The invention applies to both these possibilities.

As an example, a description shall be given of the insertion of a gaseous phase in a cavity made in a semiconductor structure.

Figure 2A:
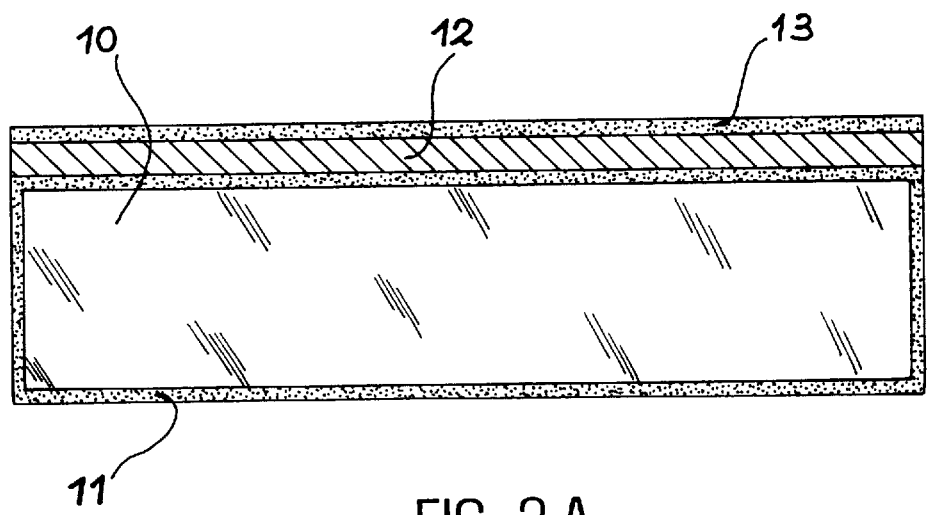
FIGS. 2A, 2B and 2C are section views showing how a cavity is made in a semiconductor structure.
Figure 2B:
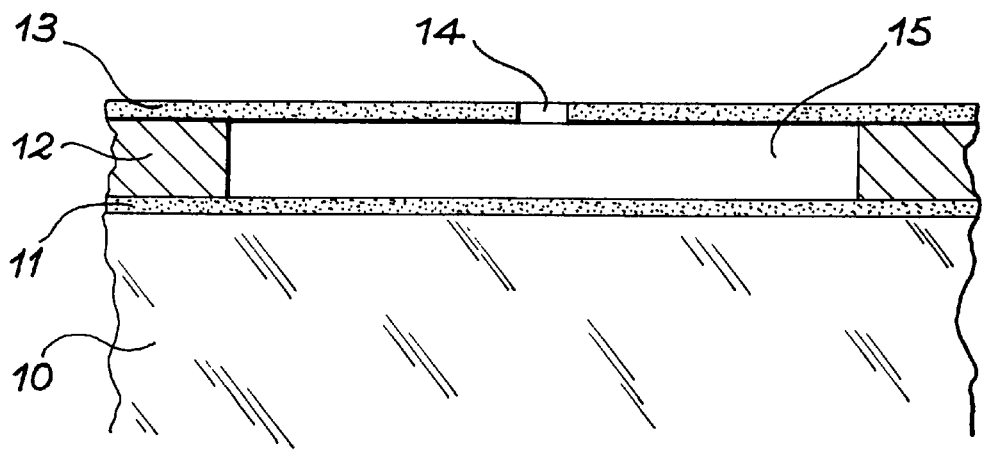
Figure 2C:
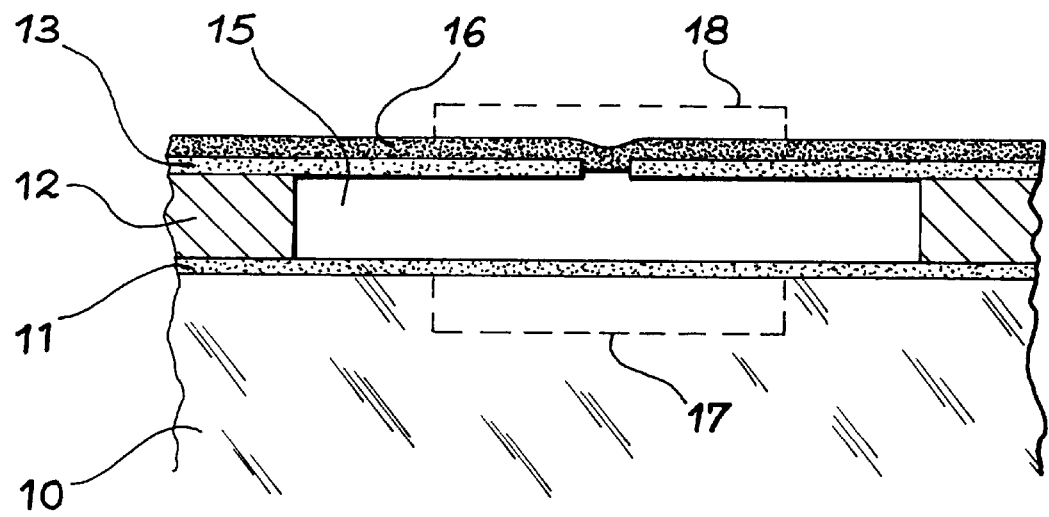

FIGS. 2A, 2B and 2C are cross-section views of a semiconductor structure made for example from a substrate 10 of doped monocrystalline silicon n. Through heat oxidation, an oxide layer, 11, of 500 nm thickness is formed on substrate 10. On one surface of the structure obtained, a layer 12 of polycrystalline silicon of 500 nm thickness is deposited. On the surface of layer 12 of polycrystalline silicon, an oxide layer 13 of 500 nm thickness is formed by heat oxidation. As oxidation consumes approximately 250 nm of the polycrystalline silicon of layer 12, the remaining thickness of this layer is 250 nm.

Using a conventional lithoetching technique, an opening 14 is made in top oxide layer 13. Opening 14 is for example a hole 1 mm in diameter. Through opening 14 it is possible to attack the polycrystalline silicon layer 12 by means of a tetramethyl ammonium hydroxide bath (TMAH). In this way a cavity 15 of 200 mm in diameter can be obtained, centred over opening 14 (see FIG. 2B).

After a drying stage, a further oxide layer 16 is deposited on oxide layer 13 to close opening 14. In this way a sealed cavity 15 is obtained in the semiconductor structure (see FIG. 2C).

In this example of embodiment, cavity 15 is in the shape of a disk 200 mm in diameter. The thickness of the unit made up of layers 13 and 16 may be in the region of 1 mm and therefore acts as a membrane sealing cavity 15. This membrane will be sensitive to the pressure differences prevailing between the inside and outside of the cavity. By inserting a gaseous phase in the cavity it will be possible to confer upon it a determined pressure.

Ion implantation may be conducted with ions of hydrogen or rare gases, preferably helium. The gaseous phase may possibly be made up of a mixture of gases. Implantation is carried out in such manner that maximum ion concentration is located inside the cavity and in a dose such that the gas phase reaches the required pressure.

Preferably the energy of implantation is chosen so that when the ions have crossed through the wall sealing the cavity, their average energy when they arrive in this cavity is very low, less than 1 keV for example. Some of the ions are slowed down through interaction with the atoms and molecules existing inside the cavity. Other ions will bounce against the bottom wall of the cavity. Others will implant themselves on its surface. The surface concentration of the bottom of the cavity very quickly reaches saturation, and consequently an equilibrium is reached and for every ion implanted one ion is desorbed. As a result, if the ions are hydrogen ions, these ions accumulate in the cavity and recombine together to form $H_2$ gas, thereby generating gas pressure. For example, if the thickness of the oxide above the cavity is 500 nm, an implantation energy of approximately 60 keV should be chosen.

Application of the law of perfect gases gives the following results. For a cavity of 1 mm average thickness, $6.10^{15}$ $H^+$ ions/cm$^2$ are needed to generate a hydrogen pressure of 1 bar. Therefore for the same cavity, 10 times more $H^+$ ions are required to generate a pressure of 10 bars.

The sealed cavity shown in FIG. 2C pressurized to a determined pressure, may serve as a capacity pressure sensor, the gaseous phase contained inside cavity 15 operating as a dielectric. In this case, capacitor electrodes may be formed firstly by initial p+ doping of one region of substrate 10, to obtain chamber 17 shown as a broken line, and secondly by depositing a metal electrode 18 (for example aluminium) also shown by a broken line, on oxide layer 16.

Figure 3:
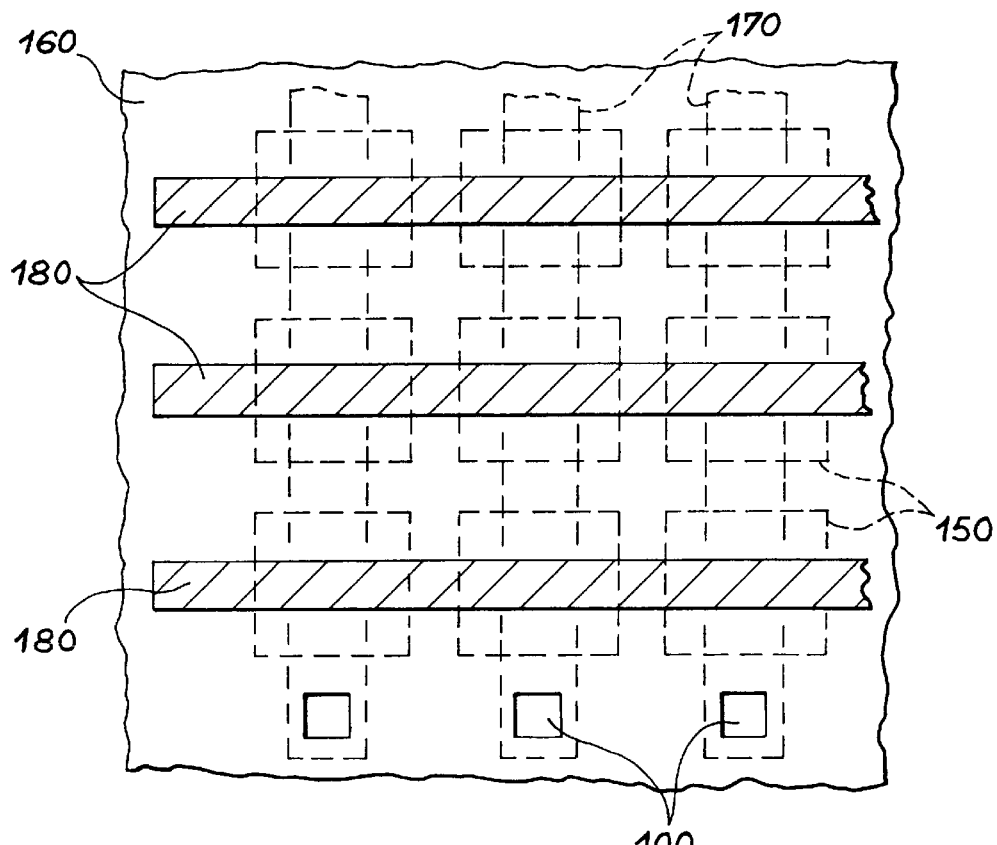
FIG. 3 is an overhead view of a matrix of pressure sensors made by applying the method of the invention.

Along the same principle, it is possible to obtain a matrix of pressure sensors. This is shown in FIG. 3 which is an overhead view of such a structure. In this Figure, the pressurized cavities are shown under reference 150, the upper oxide layer under reference 160, conductor chambers under reference 170, upper electrodes under reference 180. Reference 100 represents electric contact studs with conductor chambers 170, said studs being deposited after etching the layers overlying the chambers.

In this way, a matrix of capacitive-type pressure sensors was made. Each pressure sensor is made up of the elementary capacitor located at the intersection of one electrode 180 and one electrode 170 (or conductor chamber) between which exists a pressurized cavity 150.

The matrix of pressure sensors obtained therefore comprises rows (for example metal electrodes 180) and columns (for example conductor chambers 170). The pressure in one component (i,j) of the sensor matrix corresponding to the point of intersection of a row i with a column j, is obtained by measuring the capacity of the component (i,j). For this purpose all the rows, except row i, and all columns, except column j, are placed under high impedance. The capacity existing between row i and column j is then measured.

Figure 4:
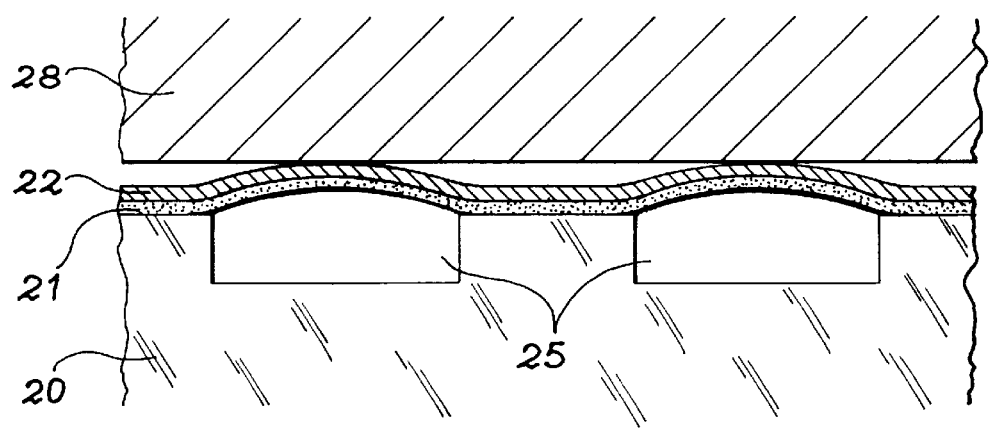
FIG. 4 is a cross-section view of a structure having a soft electrical contact obtained by applying the method of the invention.

In similar fashion, a structure having a soft electric contact with an outside element can be made. This is shown in FIG. 4 in which a multiplicity of cavities 25 are formed in a monocrystalline silicon substrate 20 and sealed by an oxide membrane 21. Using a masking technique, only cavities 25 receive ion bombardment in a dose such that said cavities are pressurized, which causes membrane 21 sealing these cavities to bulge and to form bosses or pads. Membrane 21 is covered by a metal layer 22. In this way a structure is obtained with which a soft electric contact can be made with an outside element 28.

Although the examples described above relate to a structure whose main constituent parts are in silicon and silicon oxide, the method of the present invention may be applied to any solid material provided that the thickness of the components allows ions to be implanted in appropriate manner in a cavity which is formed within this structure.

I claim:

1. A method for inserting a gaseous phase in a sealed cavity, comprising:
   inserting ions in said sealed cavity by ion implantation carried out at an energy level sufficient for the inserted ions to reach the sealed cavity and to form a gas having a gas pressure inside said sealed cavity.

2. A method according to claim 1, wherein inserting ions by ion implantation is performed so that said gas formed in the sealed cavity has a predetermined gas pressure.

3. A method according to claim 1, wherein inserting ions by ion implantation is carried out at an energy level so that, given a thickness and a material of a portion of the sealed cavity though which the ions are inserted, a maximum concentration of ions reach said sealed cavity.

4. A method according to claim 1, wherein inserting ions by ion implantation is performed by inserting ions of different elements.

5. A method according to claim 1, wherein inserting ions by ion implantation is performed by inserting hydrogen ions.

6. A method according to claim 1, wherein inserting ions by ion implantation is performed by inserting ions of a rare gas.

7. A method according to claim 1, wherein inserting ions by ion implantation is performed by inserting helium ions.

8. A method according to claim 1, wherein inserting ions by ion implantation is performed so that said gas pressure inside the sealed cavity deforms a wall of the sealed cavity.

9. A method according to claim 1, wherein inserting ions by ion implantation is performed so that said gas pressure inside the sealed cavity deforms a wall of the sealed cavity into an outwardly curved surface.

10. A method according to claim 1, wherein inserting ions by ion implantation is performed so that said gas pressure inside the sealed cavity deforms a wall of the sealed cavity into a pad shape.

11. A method according to claim 1, wherein inserting ions by ion implantation is performed so that said gas pressure inside the sealed cavity causes a membrane sealing the sealed cavity to bulge.

12. A method of manufacturing a structure having a soft electrical contact, comprising:
   forming a cavity sealed by a wall;
   rendering an outside surface of said wall electrically conductive; and
   inserting ions in said sealed cavity by ion implantation carried out at an energy level sufficient for the inserted ions to reach the sealed cavity and to form a gas having a gas pressure inside said sealed cavity.

13. A method according to claim 12, wherein rendering said outside surface of said wall electrically conductive is performed by coating said outside surface with a metal layer.

14. A method according to claim 12, wherein forming the sealed cavity comprises:

forming a first oxide layer on a substrate;

depositing a polycrystalline silicon layer on said first oxide layer;

forming a second oxide layer by heat oxidation on said polycrystalline silicon layer;

forming an opening in said second oxide layer by litho-etching;

forming an open cavity in said polycrystalline silicon layer by introducing an attacking bath though said opening;

forming a third oxide layer on said second oxide layer thereby closing said opening.

15. A method according to claim 14, wherein forming an open cavity in said polycrystalline silicon layer is performed by introducing a bath of tetramethyl ammonium hydroxide.

16. A method according to claim 12, wherein inserting ions by ion implantation is performed by inserting ions of different elements.

17. A method according to claim 12, wherein inserting ions by ion implantation is performed by inserting hydrogen ions.

18. A method according to claim 12, wherein inserting ions by ion implantation is performed by inserting ions of a rare gas.

19. A method according to claim 12, wherein inserting ions by ion implantation is performed by inserting helium ions.

20. A method according to claim 12, wherein inserting ions by ion implantation is performed so that said gas pressure inside the sealed cavity deforms a wall of the sealed cavity.

21. A method according to claim 12, wherein inserting ions by ion implantation is performed so that said pressure inside the sealed cavity deforms a wall of the sealed cavity into an outwardly curved surface.

22. A method according to claim 12, wherein inserting ions by ion implantation is performed so that said pressure inside the sealed cavity deforms a wall of the sealed cavity into a pad shape.

23. A method of manufacturing a capacitor, comprising:

forming a first capacitor electrode on a substrate;

forming a sealed cavity positioned on said first capacitor electrode;

inserting ions in said sealed cavity by ion implantation carried out at an energy level sufficient for the inserted ions to reach the sealed cavity and to form a gas having a gas pressure and dielectric properties inside said sealed cavity; and depositing a second capacitor electrode on said cavity.

24. A method according to claim 23, wherein inserting ions by ion implantation is performed so that said gas pressure inside the sealed cavity deforms a wall of the sealed cavity.

25. A method according to claim 23, wherein inserting ions by ion implantation is performed so that said pressure inside the sealed cavity deforms a wall of the sealed cavity into an outwardly curved surface.

26. A method according to claim 23, wherein inserting ions by ion implantation is performed so that said pressure inside the sealed cavity deforms a wall of the sealed cavities into a pad shape.

27. A method for manufacturing a matrix of pressure sensors, comprising:

forming a plurality of columns of conducting material;

forming a plurality of rows of electrodes;

forming a plurality of sealed cavities positioned at intersections of said columns of conducting material and rows of electrodes; and inserting ions in said plurality of sealed cavities by ion implantation carried out at an energy level sufficient for the inserted ions to reach the sealed cavities and to form a gas having a gas pressure and dielectric properties inside said sealed cavities.

* * * * *